(12) United States Patent
Lee et al.

(10) Patent No.: US 8,085,072 B2
(45) Date of Patent: Dec. 27, 2011

(54) SEMICONDUCTOR INTEGRATED CIRCUIT HAVING DELAY LOCKED LOOP CIRCUIT

(75) Inventors: Hyun Woo Lee, Gyeonggi-do (KR); Won Joo Yun, Gyeonggi-do (KR)

(73) Assignee: Hynix Semiconductor Inc., Gyeonngi-do (KR)

( * ) Notice: Subject to any disclaimer, the term of this patent is extended or adjusted under 35 U.S.C. 154(b) by 0 days.

(21) Appl. No.: 12/648,380

(22) Filed: Dec. 29, 2009

(65) Prior Publication Data

US 2011/0102035 A1    May 5, 2011

(30) Foreign Application Priority Data

Oct. 29, 2009    (KR) .................. 10-2009-0103720

(51) Int. Cl.
*H03L 7/06* (2006.01)
(52) U.S. Cl. .......................... 327/158; 327/149
(58) Field of Classification Search .................. 327/149, 327/158
See application file for complete search history.

(56) References Cited

U.S. PATENT DOCUMENTS

| | | | |
|---|---|---|---|
| 6,137,328 A | 10/2000 | Sung | |
| 6,437,616 B1 * | 8/2002 | Antone et al. | 327/158 |
| 6,445,234 B1 | 9/2002 | Yoon et al. | |
| 6,731,667 B1 * | 5/2004 | Lee et al. | 375/130 |
| 6,744,324 B1 * | 6/2004 | Adams et al. | 331/17 |
| 6,839,301 B2 | 1/2005 | Lin et al. | |
| 7,084,709 B1 * | 8/2006 | Leong et al. | 331/11 |
| 7,098,712 B2 * | 8/2006 | Lee | 327/161 |
| 7,180,377 B1 * | 2/2007 | Leong et al. | 331/17 |
| 7,372,339 B2 * | 5/2008 | Fu | 331/16 |
| 7,428,284 B2 * | 9/2008 | Lin | 375/355 |
| 7,576,576 B2 * | 8/2009 | Drexler et al. | 327/156 |
| 7,868,670 B2 * | 1/2011 | Becke et al. | 327/156 |
| 7,880,519 B2 * | 2/2011 | Senda et al. | 327/161 |
| 7,956,658 B2 * | 6/2011 | Lee et al. | 327/159 |
| 2002/0109495 A1 * | 8/2002 | Antone et al. | 324/76.54 |
| 2003/0169086 A1 * | 9/2003 | Lee et al. | 327/158 |
| 2005/0024108 A1 | 2/2005 | Lin | |
| 2007/0007941 A1 | 1/2007 | Lin et al. | |
| 2007/0103214 A1 * | 5/2007 | Drexler et al. | 327/156 |
| 2008/0054960 A1 * | 3/2008 | Becke et al. | 327/157 |
| 2008/0315926 A1 * | 12/2008 | Yoo | 327/157 |
| 2010/0271072 A1 * | 10/2010 | Lee et al. | 327/23 |
| 2010/0321074 A1 * | 12/2010 | Song | 327/157 |

FOREIGN PATENT DOCUMENTS

JP    2004-362757 A    12/2004

* cited by examiner

*Primary Examiner* — Lincoln Donovan
*Assistant Examiner* — Adam Houston
(74) *Attorney, Agent, or Firm* — Ladas & Parry LLP

(57) ABSTRACT

A semiconductor integrated circuit is provided. The semiconductor integrated circuit includes: a delay locked loop (DLL) output block configured to delay an input clock signal by a predetermined time in response to a plurality of delay control signals and provide a DLL clock signal; a locking control block configured to compare a phase of a reference clock signal and a phase of a feedback clock signal, and synchronize the phase of the reference clock signal and the phase of the feedback clock signal in response to the plurality of delay control signals; and a locking detection block configured to detect whether the phase of the reference clock signal and the phase of the feedback clock signal are synchronized and the DLL clock signal is locked, wherein, when the DLL clock signal is locked, the locking control block provides the reference clock signal, which is obtained by dividing the input clock signal by n (where n is a natural number equal to or greater than 2), as an internal DLL clock signal.

18 Claims, 4 Drawing Sheets

SEMICONDUCTOR INTEGRATED CIRCUIT HAVING DELAY LOCKED LOOP CIRCUIT

CROSS-REFERENCES TO RELATED APPLICATION

The present application claims priority under 35 U.S.C. §119(a) to Korean application number 10-2009-0103720, filed on Oct. 29, 2009, in the Korean Intellectual Property Office, which is incorporated herein by reference in its entirety as set forth in full.

BACKGROUND

1. Technical Field

The present invention relates to a semiconductor integrated circuit, and more particularly, to a semiconductor integrated circuit having a delay locked loop circuit.

2. Related Art

Generally, a timing skew problem arises between an external clock signal and an internal clock signal. Therefore, a circuit configured to synchronize data with a clock signal exactly is required. A delay locked loop (hereinafter, referred to as a "DLL") circuit is widely used as a synchronization circuit. The DLL circuit is a circuit which is configured to generate a locked internal clock signal by delaying an input clock signal.

That is, a DLL circuit is configured to generate an internal clock signal a phase of which leads a phase of an input clock signal by a predetermined time, so that data may be outputted without delay relative to the input clock signal. To implement this function, a conventional DLL circuit is configured to include a clock buffer, a delay device, a phase comparison device, a delay control device, a shift register, and so on.

Such a DLL circuit operates at the same frequency as a clock frequency. Thus, as the clock frequency increases, the above-mentioned circuits operate in response to the clock signal having a high frequency, thus increasing the current consumption of the DLL circuit. Furthermore, even after the input clock signal is already locked to be suitable for the internal clock signal, the DLL circuit operates at the same frequency as the input clock signal. Consequently, unnecessary current consumption is increased.

SUMMARY

A semiconductor integrated circuit having a DLL circuit with improved power consumption is described herein.

In one embodiment of the present invention, a semiconductor integrated circuit includes: a delay locked loop (DLL) output block configured to delay an input clock signal by a predetermined time in response to a plurality of delay control signals and provide a DLL clock signal; a locking control block configured to compare a phase of a reference clock signal and a phase of a feedback clock signal, and synchronize the phase of the reference clock signal and the phase of the feedback clock signal in response to the plurality of delay control signals; and a locking detection block configured to detect whether the phase of the reference clock signal and the phase of the feedback clock signal are synchronized and the DLL clock signal is locked, wherein, when the DLL clock signal is locked, the locking control block provides the reference clock signal, which is obtained by dividing the input clock signal by n (where n is a natural number equal to or greater than 2), as an internal DLL clock signal.

In another embodiment of the present invention, semiconductor integrated circuit includes: a first delay line configured to delay an input clock signal according to a delay control signal and provide the delayed input clock signal as a DLL clock signal; and a second delay line configured to delay a reference clock signal according to the delay control signal and provide the delayed reference clock signal as an internal DLL clock signal, wherein the is input clock signal and the reference clock signal have the substantially same frequency until before the phase of the DLL clock signal is locked, and have different frequencies after the phase of the DLL clock signal is locked.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through preferred embodiments.

Figure 1:
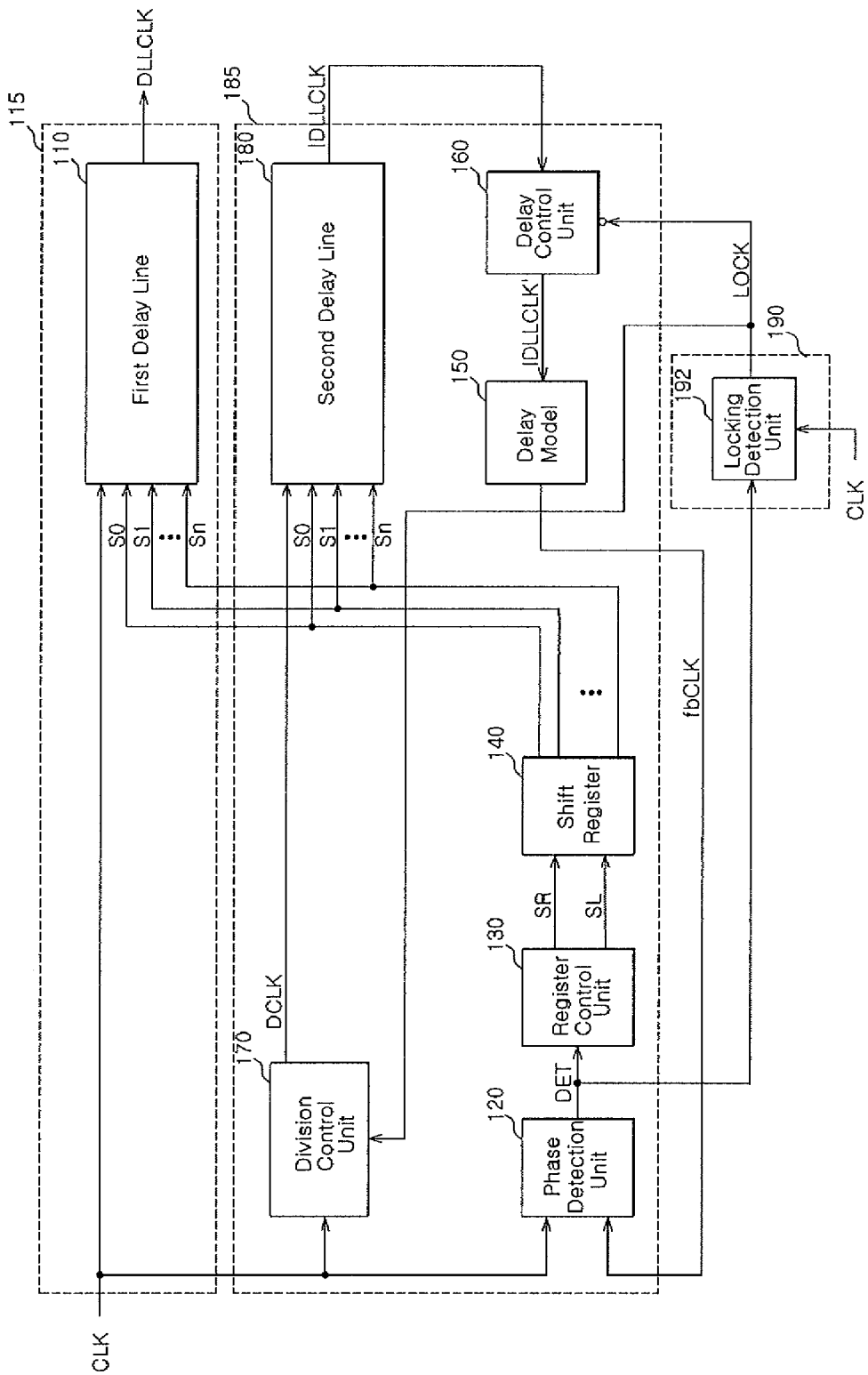
FIG. 1 is a conceptual block diagram of a semiconductor integrated circuit according to one embodiment.

FIG. 1 is a block diagram of a semiconductor integrated circuit having a DLL circuit according to one embodiment.

Referring to FIG. 1, the semiconductor integrated circuit includes a DLL output block 115, a locking control block 185, and a locking detection block 190.

The DLL output block 115 includes a first delay line 110.

The first delay line 110 is configured to delay an input clock signal CLK by a predetermined time in response to a plurality of delay control signals S0 to Sn, and output the delayed input clock signal CLK as a DLL clock signal DLLCLK.

The locking control block 185 is configured to delay a reference clock signal DCLK by a predetermined time in response to the plurality of delay control signals S0 to Sn, and output an internal DLL clock signal IDLLCLK.

The locking control block 185 includes a phase detection unit 120, a register control unit 130, a shift register 140, a delay model 150, a delay control unit 160, a division control unit 170, and a second delay line 180.

The phase detection unit 120, the register control unit 130, the shift register 140, and the delay model 150 constitute a typical DLL circuit, which can be easily understood by those skilled in the art. Thus, those units will be described briefly.

When the DLL clock signal DLLCLK is locked, the locking control block 185 according to one embodiment divides the input clock signal CLK by n (where n is a natural number equal to or greater than 2) and provides the divided input clock signal in order that the phase detection unit 120, the register control unit 130, the shift register 140, and the delay model 150 operate in response to a clock signal having a lower frequency than the input clock signal CLK.

The phase detection unit 120 is configured to receive the input clock signal CLK and a feedback clock signal fbCLK, compare the phases of the two clock signals CLK and fbCLK, and provide a detection signal DET as the comparison result signal. The phase detection unit 120 provides the detection signal DET having a high level when the phase of the input clock signal CLK leads the phase of the feedback clock signal fbCLK, and provides the detection signal DET having a low level when the phase of the feedback clock signal fbCLK leads the phase of the input clock signal CLK. The phase relationship of the input clock CLK and the feedback clock signal fbCLK according to the level of the detection signal can be known.

The register control unit 130 is configured to provide pulse-type shift control signals SR and SL in response to the detection signal DET.

The shift register 140 is configured to receive the shift control signals SR and SL and provide the plurality of delay control signals S0 to Sn which determine a delay amount according to the received shift control signals SR and SL. Subsequently, the second delay line 180 may shift the internal DLL clock signal IDLLCLK in the left or right direction according to the plurality of delay control signals S0 to Sn. Consequently, the phase of the input clock signal CLK and the phase of the feedback clock signal fbCLK are locked.

The delay model 150 is configured to receive the delay-compensated internal DLL clock signal IDLLCLK' and compensates a time difference between the input clock signal CLK and the practical DLL clock signal DLLCLK. For example, the delay model 150 is a type of a replica circuit which includes a dummy clock buffer, a dummy output buffer, and a dummy load, and compensates a delay time of the practical input clock signal CLK which is caused by the clock buffer, the output buffer, the load, and so on.

The use of the delay model 150 and the delay control unit 160, which will be described later, makes it possible to generate the feedback clock signal fbCLK which is delayed under the always same delay condition on a path through which the input clock signal CLK is outputted as the DLL clock signal DLLCLK.

Like in the typical method, according to one embodiment, the shift register 140 repeats the loop until the phase of the input clock signal CLK and the phase of the feedback clock signal fbCLK are synchronized and locked, while controlling the first delay line 110 and the second delay line 180 according to the comparison result of the phase difference between the input clock signal CLK and the feedback clock signal fbCLK. For example, the final DLL clock signal DLLCLK may be provided by repeating several hundreds of cycles.

Meanwhile, the division control unit 170 according to one embodiment may be configured to provide the non-divided input clock signal CLK as the reference clock signal DCLK in response to a locking control signal LOCK, or may be configured to divide the input clock signal CLK by a predetermined frequency and provide the divided input clock signal as the reference clock signal DCLK. More specifically, the division control unit 170 is configured to provide the reference clock signal DCLK having the substantially same frequency as the non-divided input clock signal CLK until the phase of the input clock signal CLK and the phase of the feedback clock signal fbCLK are synchronized and locked. After the phase of the input clock signal CLK and the phase of the feedback clock signal fbCLK are synchronized and locked, the division control unit 170 provides the divided clock signal, which has a lower frequency than the input clock signal CLK, as the reference clock signal DCLK. That is, when the locking signal LOCK is activated, the division control unit 170 provides a clock signal obtained by dividing the input clock signal CLK by a predetermined period. Thus, after the DLL clock signal DLLCLK is locked, peripheral circuits may be controlled to operate at a low frequency. Since the division period may be changed according to a designer's intention, various cases ranging from divide-by-2 to divide-by-128 may be applied.

Therefore, the second delay line 180 may output the signal having the substantially same frequency as the first delay line 110 according to the frequency state of the reference clock signal DCLK, or may output the signal having a lower frequency than the first delay line 110. In other words, according to one embodiment, the second delay line 180 is controlled to operate in a modeling type of the first delay line 110 which provides the final output clock signal DLLCLK, until before the DLL clock signal DLLCLK is locked. On the other hand, after the DLL clock signal DLLCLK is locked, the first delay line 110 provides the finally locked DLL clock signal DLLCLK to the inside of the chip, but the second delay line 180 provides the internal DLL clock signal IDLLCLK having a low frequency in response to a signal having a lower frequency than the input clock signal CLK because the second delay line 180 need not operate in response to the high-frequency input clock signal CLK in order to prevent the current consumption.

Meanwhile, the delay control unit 160 is configured to determine whether to delay the clock signal in order to cancel or compensate the delay time of the division control unit 170. For example, when the clock signal divided through the division operation of the division control unit 170 is provided as the reference clock signal DCLK, the clock signal is delayed by the division operation time. Thus, the delay control unit 160 must compensate the delay time as much. Therefore, reversely, when the clock signal which is not divided at the division control unit 170 is provided as the reference clock signal DCLK, the delay control unit 160 delays the clock signal by the delay time which is necessary for an operation of a divider (not shown), and provides a delay-compensated internal DLL clock to signal IDLLCLK'. On the other hand, when the clock signal which is delayed at the division control unit 170 is provided as the reference clock signal DCLK, the delay control unit 160 controls the clock signal not to pass through delay components. Accordingly, before and after the locking of the DLL clock signal DLLCLK, the delay time of the clock signal path which passes from the division control unit 170 through the second delay line 180 and the delay control unit 160 may be constantly maintained.

In other words, if the division control unit 170 provides the output signal using the divider (not shown), the delay time is not added at the delay control unit 160. On the contrary, if the division control unit 170 provides the output signal without using the divider (not shown), the delay time is added at the delay control unit 160.

The locking detection block 190 is configured to detect whether or not the phase of the reference clock signal DCLK and the phase of the feedback clock signal fbCLK are synchronized and locked.

The locking detection block 190 includes a locking detection unit 192.

The locking detection unit 192 is configured to provide the locking signal LOCK using the detection signal DET and the input clock CLK. When the DLL clock signal DLLCLK is locked, the locking detection unit 192 provides the activated locking signal LOCK.

A further detailed description will be made below with reference to the accompanying drawings.

Figure 2:
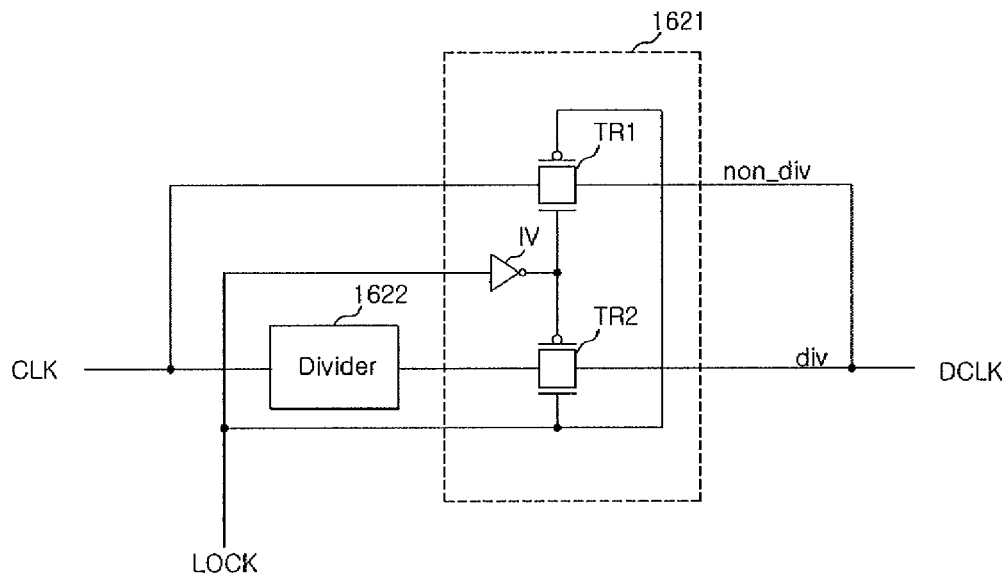
FIG. 2 is a circuit diagram of a division control unit illustrated in FIG. 1.

FIG. 2 is a circuit diagram of the division control unit 170 illustrated in FIG. 1.

Referring to FIG. 2, the division control unit 170 includes a division determiner 1621 and a divider 1622.

The division determiner 1621 is configured to determine whether to select the divided clock signal in response to the locking is signal LOCK. The division determiner 1621 includes first and second transfer units TR1 and TR2 and an inverter IV. The first transfer unit TR1 is configured to be turned on in response to a low level of the locking signal LOCK, and provide the non-divided clock signal non_div as the reference clock signal DCLK. The second transfer unit TR2 is configured to provide the divided clock signal div as the reference clock signal DCLK in response to a high level of the activated locking signal LOCK.

The divider 1622 is configured to divide the input clock signal CLK by a predetermined period and provide the divided clock signal div to the second transfer unit TR2. Although a division circuit of the divider 1622 is not illustrated, an appropriate division circuit may be provided according to a designer's intention. For example, although a divide-by-128 circuit is further effective in reducing the current consumption, any type of a divider may be applied only if the divided clock signal div outputted from the divider 1622 has a lower clock frequency than the input clock signal CLK.

Figure 3:
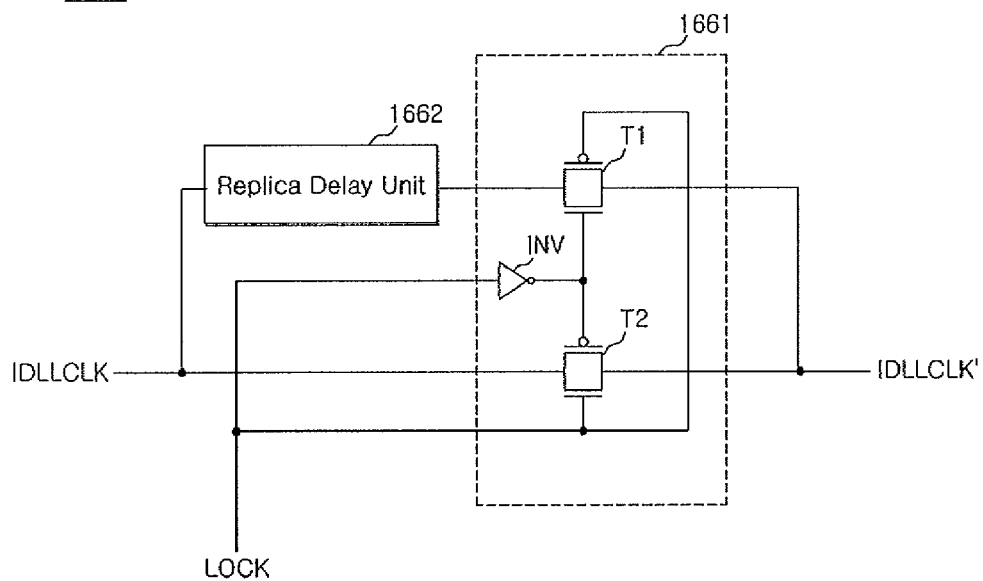
FIG. 3 is a circuit diagram of a delay control unit illustrated in FIG. 1.

FIG. 3 is a circuit diagram of the delay control unit 160 illustrated in FIG. 1.

The delay control unit 160 is configured to compensate the delay time of the division control unit (see 170 in FIG. 2). As described above, the time taken for the input clock signal CLK to pass through the divider (see 1622 in FIG. 2) and be divided has a predetermined delay time. However, the clock signal which does not pass through the divider (see 1622 in FIG. 2) is outputted without delay. Therefore, in the case of the reference clock signal DCLK provided from the division control unit (see 162 in FIG. 2), whether to add the delay time may be changed. The delay time is reversely cancelled or compensated at the delay control unit 160. Therefore, in any cases (the internal DLL clock signal IDLLCLK is either locked or unlocked), the total sum of the delay time in the course of the path from the input clock signal CLK to the delay-compensated internal DLL clock signal IDLLCLK' may be maintained to be substantially constant.

The delay control unit 160 includes a delay determination unit 1661 and a replica delay unit 1622.

The delay determination unit 1661 determines whether to select the additionally delayed signal in response to the locking signal LOCK. The delay determination unit 1661 includes first and second transfer units T1 and T2 and an inverter INV. The first transfer unit T1 is configured to be turned on in response to a low level of the deactivated locking signal LOCK and provide the signal, which is additionally delayed by the replica delay unit 1662, as the delay-compensated internal DLL clock IDLLCLK'. The second transfer unit T2 is configured to be turned on in response to a high level of the activated locking signal LOCK and provide the non-delayed internal DLL clock signal IDLLCLK as the delay-compensated internal DLL clock signal IDLLCLK'.

The replica delay unit 1622 is a replica in which the delay time of the divider (see 1622 in FIG. 2) is modeled. The replica delay is unit 1662 delays the input signal by the delay time which is spent at the divider (see 1622 in FIG. 2).

Therefore, when the locking signal LOCK is deactivated, the delay control unit 160 delays the internal DLL clock signal IDLLCLK, which is provided without delay (there is no delay time as much), by a predetermined time, and provides the delayed internal DLL clock signal as the delay-compensated internal DLL clock signal IDLLCLK'. On the other hand, when the locking signal LOCK is activated, the delay control unit 160 provides the internal DLL clock signal IDLLCLK, which is provided through the divider on the above-described path (the delay time is added as much), as the delay-compensated internal DLL clock signal IDLLCLK' to which the delay time is not added.

Figure 4:
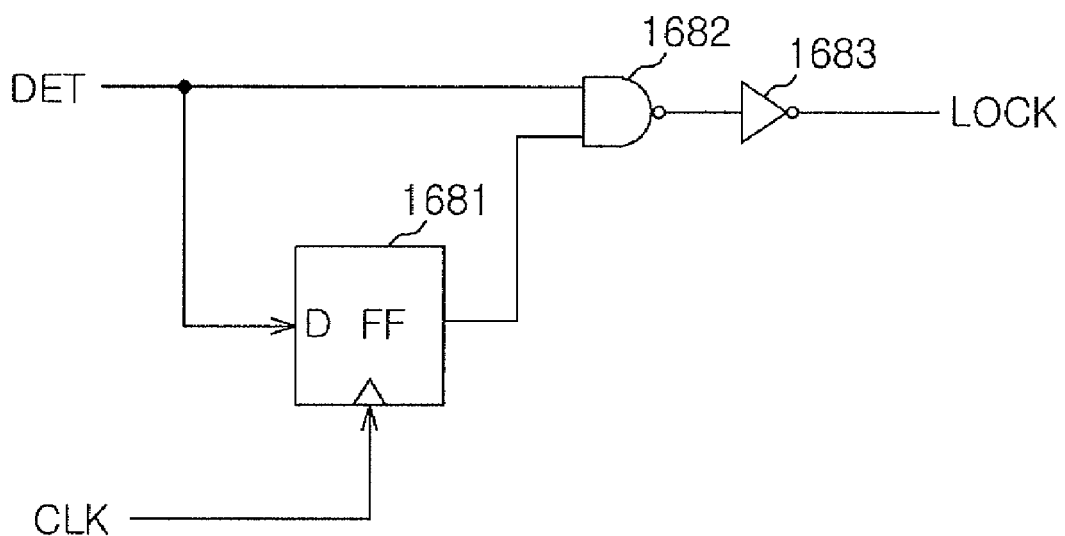
FIG. 4 is a circuit diagram of a locking detection unit illustrated in FIG. 1.

FIG. 4 is a circuit diagram of the locking detection unit 192 illustrated in FIG. 1.

The locking detection unit 192 is configured to detect whether the locking is achieved or not by using the detection signal DET and the input clock signal CLK.

The locking detection unit 192 includes a flip-flop 1681, a NAND gate 1682, and an inverter 1683.

The flip-flop 1681 is configured to receive the input clock signal CLK at a clock terminal, and receive the detection signal DET at an input terminal.

The NAND gate 1682 is configured to output a NAND combination result of the detection signal DET and the output signal of the flip-flop 1681.

The inverter 1683 is configured to invert the output signal of the NAND gate 1682 and output the locking signal LOCK.

Upon operation of the locking detection unit 192, when the input clock signal CLK transits to a high level, the locking detection unit 192 outputs a latched detection signal DET and detects a locking state. That is, the case where the detection signal DET has a low level will be described below. When the NAND gate 1682 receives a low level, it outputs a high level, and the output signal of the NAND gate 1682 is inverted by the inverter 1683 to thereby output the locking signal LOCK having a low level. Reversely, the state of the input clock signal CLK, which is looked from a rising edge of the feedback clock signal fbCLK, is a low level. Therefore, since the feedback clock signal fbCLK and the input clock signal CLK are not yet synchronized, the locking signal LOCK will become a low level.

At the moment the feedback clock signal fbCLK is gradually shifted and thus the state of the input clock signal CLK looked from the rising edge of the feedback clock signal fbCLK becomes a high level, the detection signal DET will also become a high level. At this time, the detection signal DET, which is the result obtained by detecting the state of the input clock signal CLK at the rising edge of the feedback clock signal fbCLK, is a high level, and the NAND gate 1682 receives a high level at the moment the input clock signal CLK transits to a high level, thereby providing a low level. Therefore, the high-level signal inverted by the inverter 1683 may be detected as the locking signal LOCK. That is, the locking detection unit 192 may detect the locking moment and provide the activated locking signal LOCK.

According to one embodiment, when the locking of the input clock signal CLK is completed, the locked DLL clock signal DLLCLK is provided to other circuit blocks inside the chip. However, in order to reduce the power consumption, the clock signal having a lower frequency than the input clock signal CLK is generated and provided to the DLL control circuits.

Figure 5:
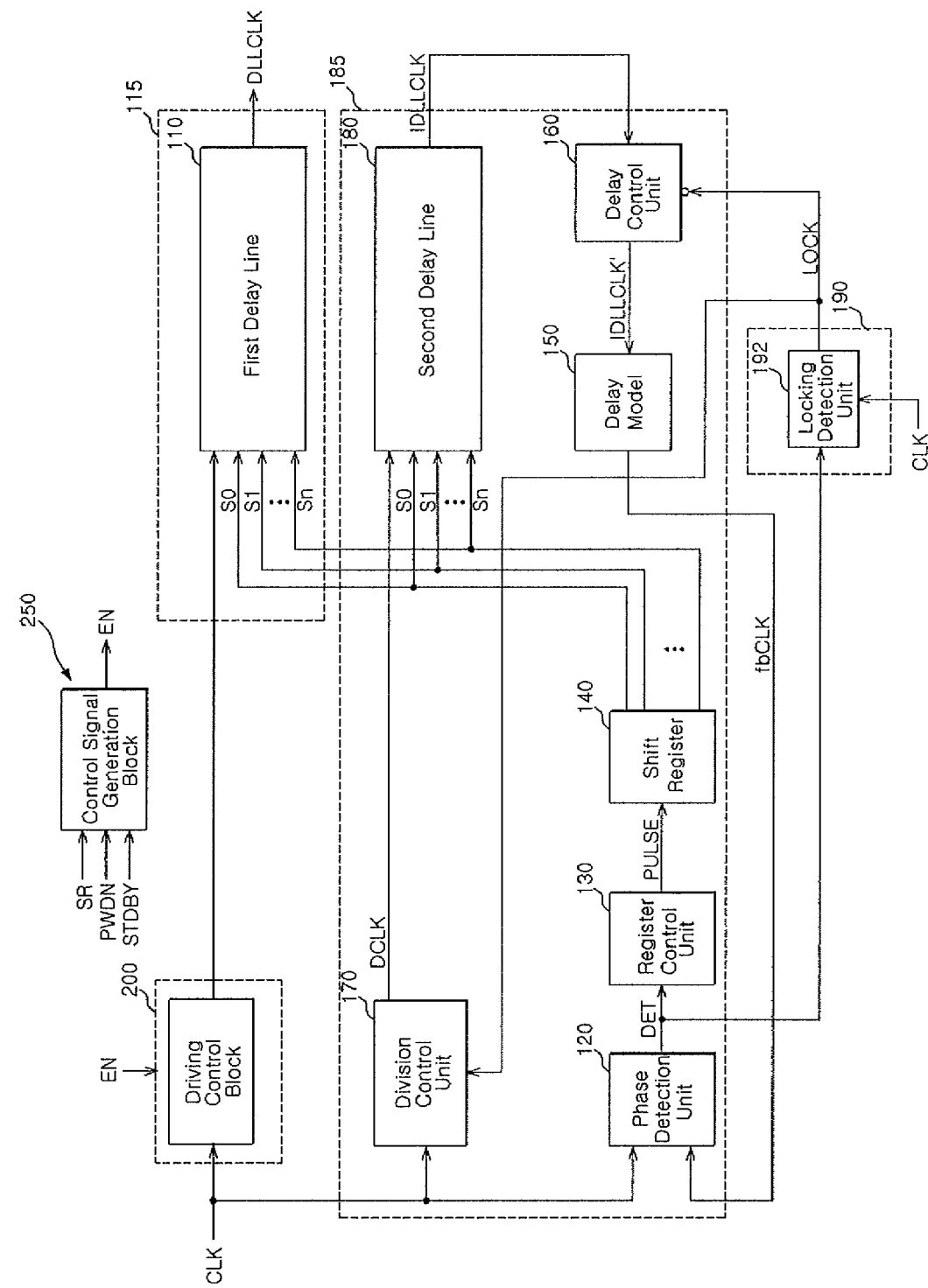
FIG. 5 is a conceptual block diagram of a semiconductor integrated circuit according to another embodiment.

FIG. 5 is a block diagram of a semiconductor integrated circuit according to another embodiment.

Referring to FIG. 5, a driving control block 200 is further provided. To avoid duplicate description, only different parts from those of FIG. 1 will be described in detail.

The semiconductor integrated circuit according to another embodiment uses the driving control block 200 in order to further reduce the power consumption.

The driving control block 200 determines whether to interrupt the signal path from the input clock signal CLK to the first delay line 110 in response to a driving control signal EN.

In other words, when the driving control signal EN is activated, the driving control block 200 provides the signal path from the input clock signal CLK to the first delay line 110, so that the locked DLL clock signal DLLCLK may be provided to the circuits inside the chip. On the contrary, when the driving control signal EN is deactivated, the driving control block 200 interrupts the signal path from the input clock signal CLK to the first delay line 110, so that the DLL clock signal DLLCLK is not provided to the circuits inside the chip. This is done for further reducing the power consumption of the DLL circuit by providing the DDL clock signal DLLCLK only when necessary. Meanwhile, the DLL clock signal DLLCLK is not necessary in a power down mode, a self refresh mode, or a stand-by mode.

The control signal EN may be generated from a control signal generation block 250.

The control signal generation block 250 is configured to provide the control signal EN in response to a command combination signal.

More specifically, the activated control signal EN may be provided in response to any one activated signal among a self refresh mode signal SR, a power down mode signal PWDN, and a standby mode signal STDBY.

According to one embodiment, after the locking of the input clock signal CLK, the clock signal having a lower frequency than the input clock signal CLK is provided to the internal circuits of the DLL, thereby improving the unnecessary power consumption of the DLL circuit. Furthermore, when the DLL clock signal DLLCLK is unnecessary, the output path of the DLL clock signal DLLCLK may also be interrupted.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit comprising:
   a delay locked loop (DLL) output block configured to delay an input clock signal by a predetermined time in response to a plurality of delay control signals and provide a DLL clock signal;
   a locking control block configured to compare a phase of a reference clock signal and a phase of a feedback clock signal, and synchronize the phase of the reference clock signal and the phase of the feedback clock signal in response to the plurality of delay control signals; and
   a locking detection block configured to detect whether the phase of the reference clock signal and the phase of the feedback clock signal are synchronized and the DLL clock signal is locked, and activate a locking signal when the DLL clock signal is locked,
   wherein the locking control block is configured to receive the locking signal and provide the reference clock signal, which is obtained by dividing the input clock signal by n (where n is a natural number equal to or greater than 2), as an internal DLL clock signal, when the locking signal is activated.

2. The semiconductor integrated circuit of claim 1, wherein the DLL output block comprises a first delay line configured to provide a DLL clock signal having a fixed period in response to the delay control signals and the input clock signal after the phase of the input clock signal and the phase of the feedback clock signal are synchronized and locked.

3. The semiconductor integrated circuit of claim 1, wherein the locking detection block comprises a locking detection unit configured to detect whether the phase of the reference clock signal and the phase of the feedback clock signal are synchronized, and provide the locking signal.

4. The semiconductor integrated circuit of claim 3, wherein the locking detection unit is configured to provide the activated locking signal when the phase of the reference clock signal and the phase of the feedback clock signal are synchronized.

5. The semiconductor integrated circuit of claim 3, wherein the locking control block comprises:
   a phase detection unit configured to compare and detect a phase difference between the reference clock signal and the feedback clock signal generated in response to the internal DLL clock signal;
   a register control unit configured to provide a shift control signal according to the detection result of the phase detection unit;
   a shift register configured to receive the shift control signal and provide a delay control signal which controls a delay amount of the feedback clock signal;
   a division control unit controlled by the locking signal and configured to determine whether to divide the input clock signal and provide a reference clock signal;
   a second delay line configured to provide the internal DLL clock signal in response to the reference clock signal and the delay control signal; and
   a delay control unit controlled by the locking signal and configured to determine whether to additionally delay the internal DLL clock signal according to the output result of the division control unit.

6. The semiconductor integrated circuit of claim 5, wherein the division control unit comprises:
   a divider configured to divide the input clock signal by a predetermined period; and
   a division determination unit comprising first and second transfer units configured to selectively provide the input clock signal and an output signal of the divider according to the level of the locking signal.

7. The semiconductor integrated circuit of claim 6, wherein the division determination unit is configured to provide the non-divided input clock signal when the locking signal is deactivated, and provide the divided input clock signal when the locking signal is activated.

8. The semiconductor integrated circuit of claim 5, wherein the second delay line is configured to provide the internal DLL clock signal having the substantially same frequency as the input clock signal, or provide the internal DLL clock signal having a lower frequency than the input clock signal in response to a frequency of the reference clock signal.

9. The semiconductor integrated circuit of claim 5, wherein the delay control unit is configured to provide the internal DLL clock signal delayed by a predetermined time when the locking signal is deactivated, and provide the internal DLL clock signal without delay when the locking signal is activated.

10. A semiconductor integrated circuit comprising:
    a first delay line configured to delay an input clock signal according to a delay control signal and provide the delayed input clock signal as a DLL clock signal; and
    a second delay line configured to delay a reference clock signal according to the delay control signal and provide the delayed reference clock signal as an internal DLL clock signal,
    wherein the input clock signal and the reference clock signal have the substantially same frequency until before the phase of the DLL clock signal is locked, and have different frequencies after the phase of the DLL clock signal is locked.

11. The semiconductor integrated circuit of claim 10, wherein output signals of the first and second delay lines have the substantially same frequency as the input clock signal until before the phase of the DLL clock signal is locked, and the output signal of the second delay line has a lower frequency than the output signal of the first delay line after the phase of the DLL clock signal is locked.

12. The semiconductor integrated circuit of claim 11, wherein, after the phase of the DLL clock signal is locked, the first delay line provides the DLL clock signal having the substantially same frequency as the input clock signal.

13. The semiconductor integrated circuit of claim 10, further comprising:
   a division control block configured to control whether to divide the input clock signal according to whether the phase of the DLL clock signal is locked; and
   a delay control block configured to determine whether to delay the internal DLL clock signal according to whether the phase of the DLL clock signal is locked.

14. The semiconductor integrated circuit of claim 13, wherein the division control block comprises:
   a divider configured to divide the input clock signal by a predetermined period; and
   a division determination unit comprising first and second transfer units configured to selectively provide the input clock signal and an output signal of the divider according to whether the phase of the DLL clock signal is locked.

15. The semiconductor integrated circuit of claim 14, wherein the division determination unit is configured to provide the non-divided input clock signal before the phase of the DLL clock signal is locked, and provide the divided input clock signal after the phase of the DLL clock signal is locked.

16. The semiconductor integrated circuit of claim 13, wherein the delay control block is configured to provide the internal DLL clock signal by a predetermined time before the phase of the DLL clock signal is locked, and provide he internal DLL clock signal without delay after the phase of the DLL clock signal is locked.

17. The semiconductor integrated circuit of claim 10, wherein the first delay line is configured to operate in response to the feedback clock signal, which is generated in response to the internal DLL clock signal, before the phase of the DLL clock signal is locked, and operate without regard to the feedback clock, whose frequency is modulated, after the phase of the DLL clock is locked.

18. The semiconductor integrated circuit of claim 1, wherein the locking control block comprises a division control unit configured to receive the locking signal and to determine whether to divide the input clock signal in response to the locking signal.

* * * * *